United States Patent [19]
Matsunami

[11] Patent Number: 5,609,967
[45] Date of Patent: Mar. 11, 1997

[54] DECORATIVE PLATE

[75] Inventor: Hiromi Matsunami, Gifu, Japan

[73] Assignee: Kayoh Technical Industry Co., Ltd., Gifu-ken, Japan

[21] Appl. No.: 369,404

[22] Filed: Jan. 5, 1995

[30] Foreign Application Priority Data

| Jan. 12, 1994 | [JP] | Japan | 6-001754 |
| Aug. 30, 1994 | [JP] | Japan | 6-205375 |

[51] Int. Cl.6 ............................ B32B 3/10; B32B 15/00
[52] U.S. Cl. ............................ 428/601; 428/614
[58] Field of Search ............................ 428/601, 614, 428/685, 672, 935, 687; 205/120

[56] References Cited

U.S. PATENT DOCUMENTS

| 1,586,927 | 6/1926 | Wilkinson et al. | 428/614 |
| 1,811,734 | 6/1931 | Trist | 428/614 |
| 2,083,249 | 6/1937 | Thomson | 205/120 |
| 2,291,854 | 8/1942 | Whyzmuzis | 428/601 |
| 3,503,815 | 3/1970 | Johnson | 428/614 |
| 4,557,596 | 12/1985 | Muller et al. | 355/132 |

FOREIGN PATENT DOCUMENTS

| 55-34660 | 3/1980 | Japan | 205/120 |
| 57-61836 | 12/1982 | Japan | 205/120 |
| 1-306592 | 12/1989 | Japan . | |

Primary Examiner—John Zimmerman
Attorney, Agent, or Firm—Nawrocki, Rooney & Sivertson, P.A.

[57] ABSTRACT

Provided is a process for preparing a decorative plate in which delicate gradation and shadow of a pattern from a photograph or the like can be reproduced with improved sharpness and clarity. The decorative plate has improved adhesive characteristics allowing the pattern forming plating layers to adhere to a substrate with excellent durability.

In the decorative plate, a plating layer is formed so that a desired pattern is formed on a substrate made of stainless steel. The portions other than the plating layer comprise a large number of lines having a predetermined line density. The decorative plate is prepared through a masking step, a plating step and a step of removing a masking layer. The masking process comprises a step of coating a light-sensitive resin on a screen having meshes, curing the light-sensitive resin using a photographic film, mounting the film on the screen and allowing the resin to cure by UV rays. The uncured resin is then removed from the screen, the screen is mounted on a substrate, and an ink layer is formed by a printing process.

9 Claims, 6 Drawing Sheets

DECORATIVE PLATE

BACKGROUND OF THE INVENTION

1. Field of the Invention

This invention relates to a decorative plate prepared by using a negative or a positive photographic film and a process for preparing the same, and particularly to a decorative plate in which a pattern is formed on a metal plate by plating and a process for preparing the same.

2. Description of the Related Art

The appearance of an image or a pattern formed on a metallic decorative plate or card is particularly good when the plate or card is formed having a substrate with a stainless steel surface. The quality of the appearance is due in part to the metallic color of a plating layer formed on the stainless steel surface, and in part to the degree which the plating layer adheres to the stainless steel. Images or patterns formed on these types of decorative plates are used for name plates, trading cards or the like.

This kind of a decorative plate and a process by which the plate is prepared were previously proposed by the present inventors (Japanese Unexamined Patent Publication No. 1-306592). The steps involved in the preparation process include forming an ink layer as a masking layer on a stainless steel surface of the substrate, removing an oxidized film on that portion of the substrate's surface not covered by an ink layer and carrying out plating treatment so that a pattern is formed on a portion of the substrate's surface where the coating film has been removed.

One consequence however of using the technique described by the 1-306592 publication, is that image reproduction is limited to what can be shown using a uniformly flat pattern set at one height against a uniformly flat background set at a different height. In other words, the plating deposited over the pattern portion is set in obvious relief against the unplated portion of the plate. As a result, when plating of a decorative plate is performed using negative photographic film, delicate gradations and shadows of the portrait cannot be expressed. Conventional decorative plates, therefore, are similar to metal plates wherein metallic foil is simply deposited onto the plate. The quality of photographic reproduction achieved by these types of decorative plates is at best limited, and does not lend itself to illustrating subtle decorative features.

SUMMARY OF THE INVENTION

Accordingly, it is a primary objective of the present invention to provide a decorative plate with improved decorative properties capable of illustrating delicate gradations and shadows of patterns and a process for preparing the same using a photograph or the like.

It is another objective of the present invention to provide a decorative plate having a pattern exhibiting various color tones and reflection degrees when the pattern is seen at different angles, and a process for preparing the same.

It is still another objective of the present invention to provide a process for preparing a decorative plate wherein the pattern and substrate portion exhibit good adhesive characteristics lending excellent durability to the plate. In order to accomplish these and other objects of the present invention, a decorative plate having a plating layer portion on a metal substrate, said plate comprising:
said layer portion forming a pattern;
a plurality of lines representing a degree of a shade of a pattern, said lines being formed on one selected from a group consisting of the layer portion and portions other than the layer portion in the plate.

BRIEF DESCRIPTION OF THE DRAWINGS

The features of the present invention that are believed to be novel are set forth with particularity in the appended claims.

The invention together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the present invention is described below with reference to FIGS. 1 through 16.

In this embodiment, a decorative plate bearing an image or decorative pattern on a substrate is described along with the process for making the same using photographic film or the like. In the various figures, the thicknesses of the respective layers such as plating layers are enlarged to more clearly illustrate the features of the invention.

Figure 1:
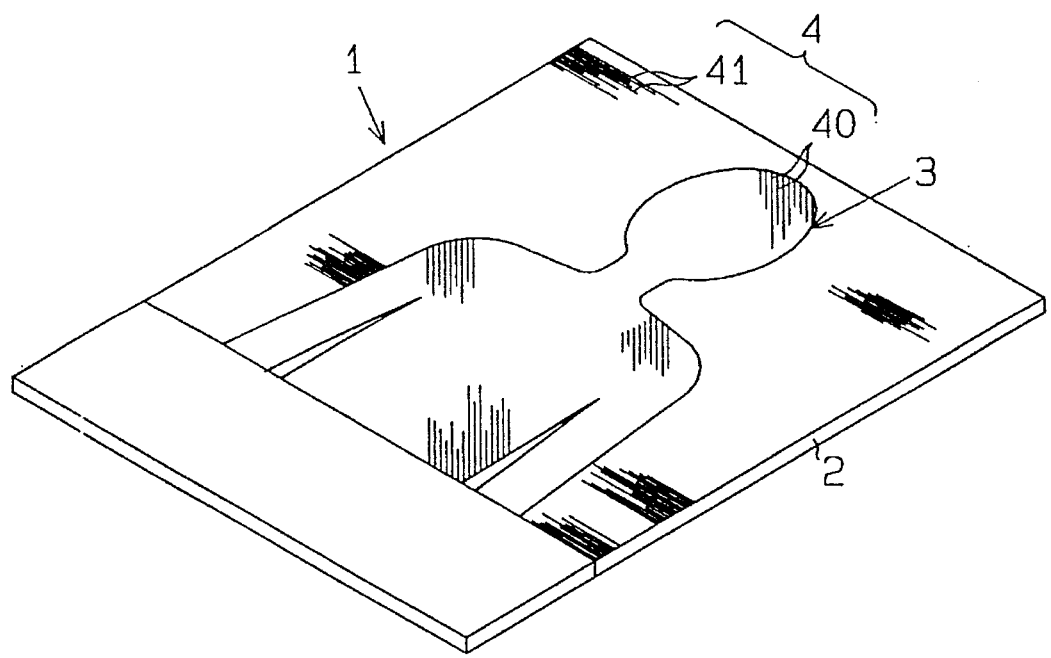
FIG. 1 is a perspective view illustrating a decorative plate of a first embodiment of the present invention.

As shown in FIG. 1, a decorative plate 1 is a metal card in which the likeness of a person or other object is formed using a gold plating layer 3 on a substrate 2 made of stainless steel. In this embodiment, the figure of a person is shown. According to the present embodiment however, any figure can be shown. The size of the substrate 2 can be, for example, a length of about 9 cm, a width of about 7 cm and a thickness of about 1.5 mm. In the decorative plate 1, the plating is formed on the substrate 2 using the photograph of the person. The gold plating layer 3 on the decorative plate 1 is formed on a portion other than a large number of lines 4 made at predetermined intervals. The lines 4 include oblique lines 40 portraying the likeness of the person and horizontal lines 41 that serve as a background to the oblique lines 40.

Next, description will be made of a process for preparing the decorative plate 1.

Figure 3:
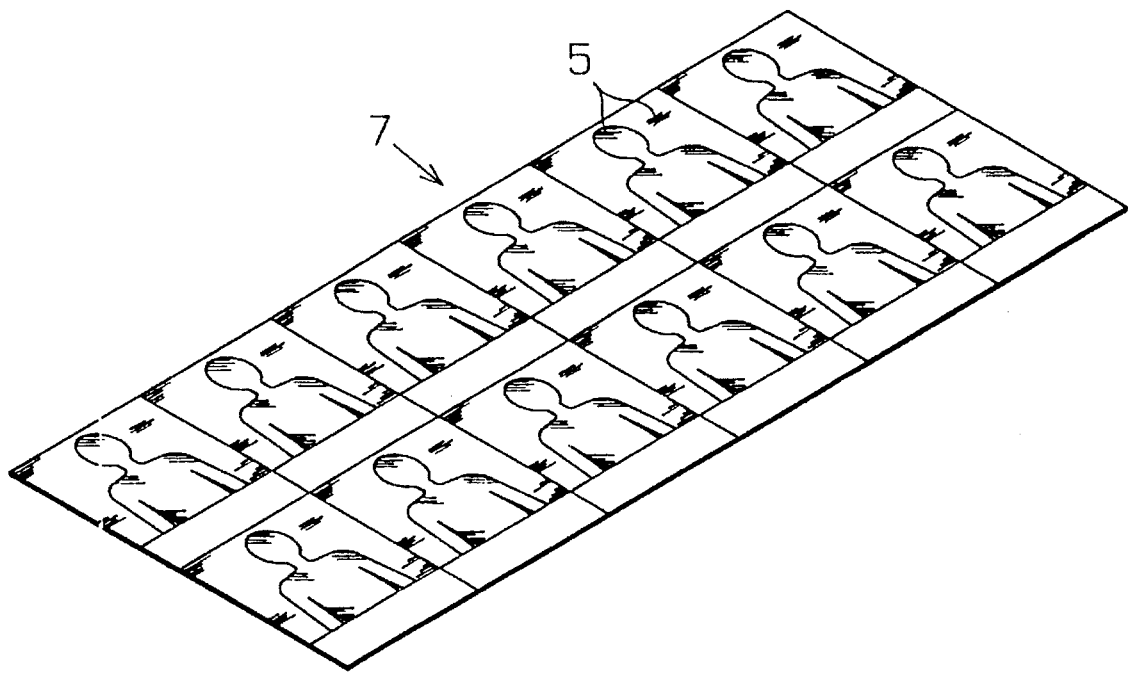
FIG. 3 is a perspective view illustrating a negative film.
Figure 4:
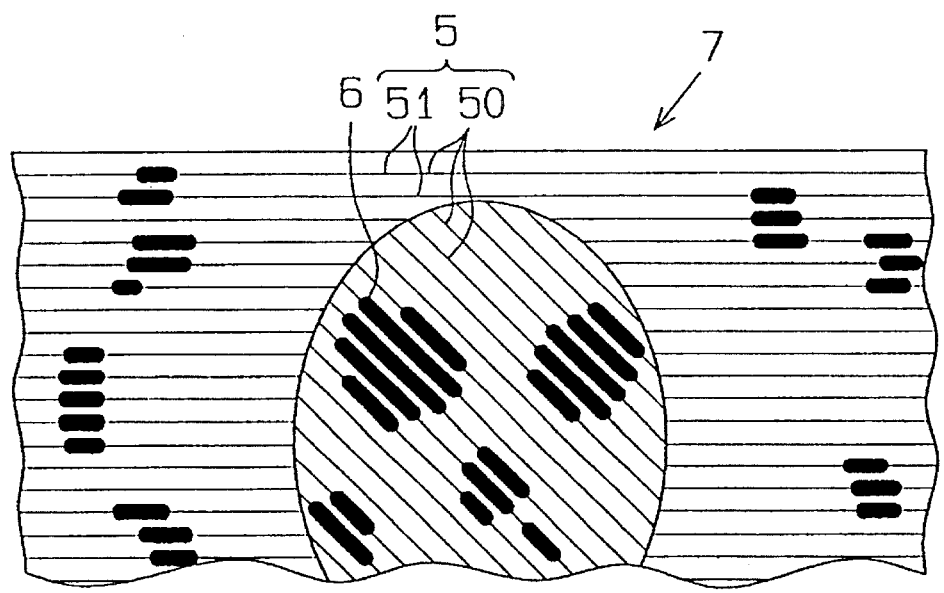
FIG. 4 is a partial enlarged view illustrating the negative film.
Figure 5:
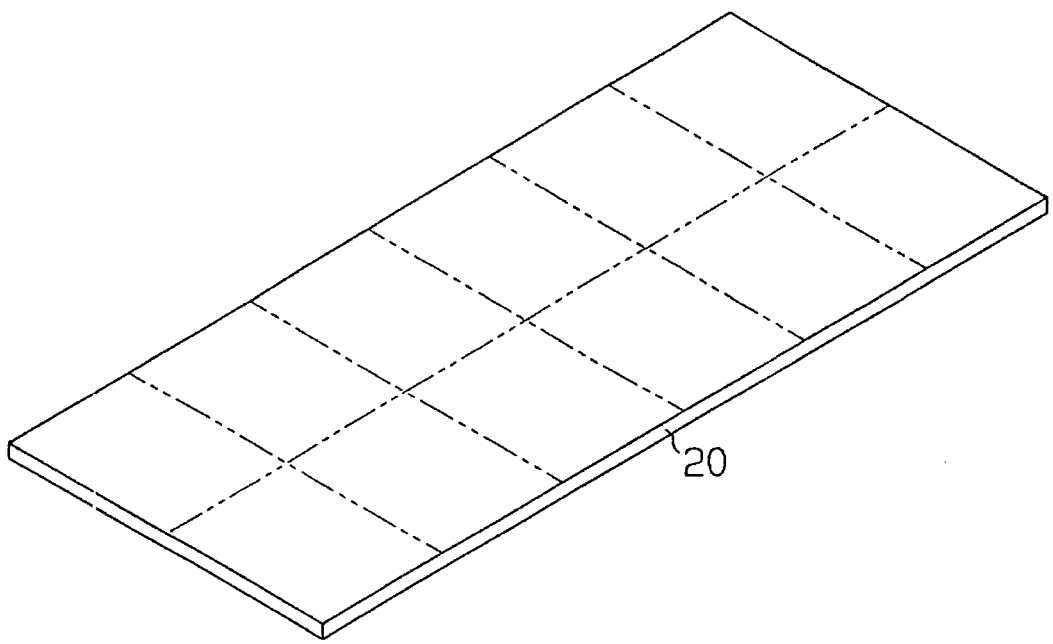
FIG. 5 is a perspective view illustrating a stainless steel plate.

First, photographic negative film 7 containing the image or likeness of a person as shown in FIG. 3 and a substrate 20 as shown in FIG. 5 are prepared. The substrate 20 contains multiple pieces, here the substrate 20 is shown having twelve decorative plates. As shown in FIG. 4, the image on the negative film 7 comprises a large number of lines 5. The portraits comprise the oblique lines 50 made in the oblique direction, and the background comprises lines 51 made in the horizontal direction. The shadow and gradation of the images are expressed by varying the thicknesses of the lines 5.

(1) Preparing the negative film

First, the negative film 7 described above is prepared as shown in FIGS. 3 and 4. A large number of the lines 5 of the negative film 7 are made at predetermined intervals. The density of the lines 5 is preferably 50 to 80 lines/inch for the following reasons.

With a line density less than the above range, the plating width, i.e., the distance separating the lines increases to a point making it appear that the plating layers are continuously formed across the substrate 20. This makes it difficult to discern any gradations that may be formed in the pattern. On the other hand, if the line density is greater than the above range, the lines 5 adjacent to each other, appear to contact each other making it difficult to form a pattern.

(2) Coating light-sensitive resin

Figure 2:
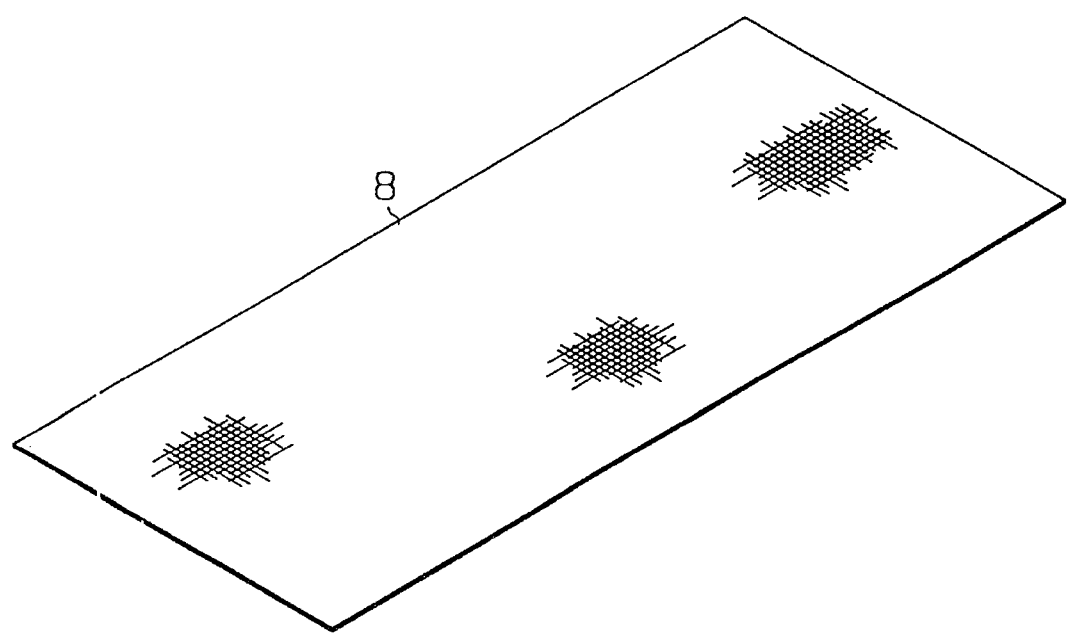
FIG. 2 is a perspective view illustrating a screen having predetermined meshes.
Figure 6:
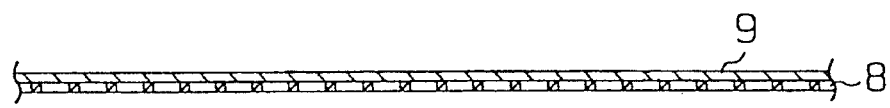
FIG. 6 is a sectional view of the decorative plate illustrating the formation of a resin layer on a screen.

A mesh screen 8 shown in FIG. 2 is made of polyester type fiber, and is coated with a light-sensitive resin solution. The mesh size of the screen 8 is 200 to 300 mesh. As shown in FIG. 6, by coating the light-sensitive resin solution on the screen 8, a resin layer 9 having a thickness of 10 to 20 μm is formed. When the negative film 7 contains a complicated pattern, the resin layer 9 is formed thin over the entire surface of the screen 8 ensuring the precise formation of the complicated pattern. On the other hand, when the pattern is relatively simple, the resin layer 9 is formed thick because the patterns can be easily formed. As the light-sensitive resin, a photocurable acrylic resin or the like can be used.

(3) Curing resin

Figure 7:
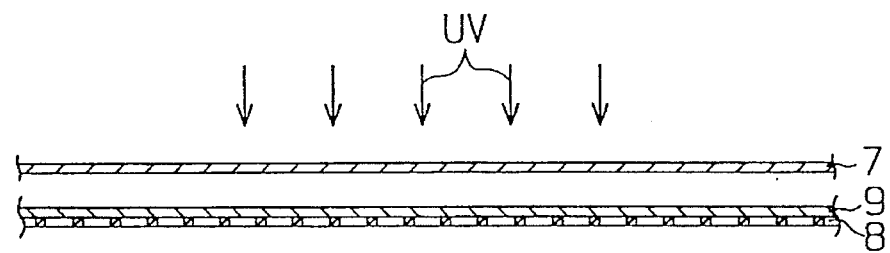
FIG. 7 is a sectional view of the decorative plate illustrating the process of irradiating light through a negative film placed above the screen.
Figure 8:
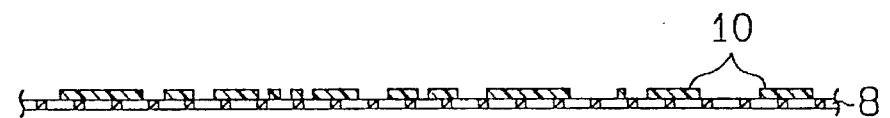
FIG. 8 is a sectional view of the decorative plate illustrating a pattern of cured resin on the screen after the removal of uncured resin.

Next, as shown in FIGS. 7 and 8, the negative film 7 is placed above the screen 8 on which the above resin layer 9 is formed, and UV rays are irradiated from the upper direction. Irradiation of UV rays cures the light-sensitive resin under the transparent portions of the film 7, i.e., at portions other than at the lines 5 and thick line portions 6. This forms a cured resin layer 10.

(4) Removing uncured resin

As shown in FIG. 8, uncured resin portions other than the cured resin layer 10 on the screen 8 are removed from the screen 8 by flowing water on the screen 8. Then, only the cured resin layer 10 remains on the screen 8. Portions of the screen 8, not covered by the cured resin layer 10, comprise lines made at predetermined intervals corresponding to the above negative film 7. For this reason, the screen 8 is often called a line screen.

(5) Forming ink layer

Figure 9:
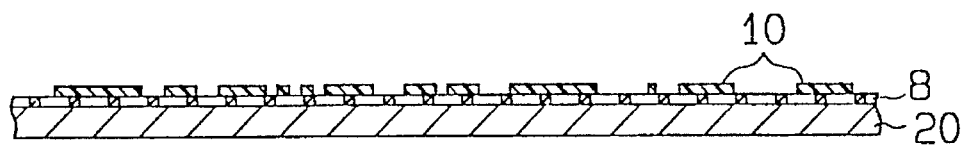
FIG. 9 is a sectional view of the decorative plate illustrating the formation of the screen absent the uncured resin removed on a stainless steel plate.
Figure 10:
FIG. 10 is a sectional view of the decorative plate illustrating the formation of an ink layer on the stainless steel plate by printing.

Next, as shown in FIG. 9, the screen 8 on which the cured resin layer 10 is formed is mounted on the substrate 20 which is subjected to mirror polishing. Silk screen printing is then performed on the screen 8 to form an ink layer 12 on the substrate 20 as a masking layer corresponding to the portions other than the cured resin layer 10.

The ink used in this process may be, for example, a type produced under the trade name by YOSHIKAWA CHEMICAL CO. [containing a resin (a hydrocarbon derivative), a solvent (aromatic hydrocarbon) and a pigment (talc) as main components]. Another example of a suitable ink is produced under the trade name M85K by TAIYO INK MFG. CO., LTD. Other acceptable inks may take the form of a plating resist or an etching resist used when a printed substrate is prepared.

During the silk screen printing process, masking is performed to prevent forming the plating layer on the substrate 20 at portions other than those laid out by the predetermined pattern. The thickness of the ink layer 12 is about 20 to 100 μm. The masking step comprises the steps of coating the light-sensitive resin, curing the resin, removing the uncured resin and forming the ink layer as described above.

(6) Plating

Prior to the plating process, anodic electrolysis is performed to reduce an oxidized layer coating on the surface of the substrate 20. The oxygen in the atmosphere oxidizes the surface of the stainless steel. The steel, thus in a passive state, oxidizes simply by being exposed to the atmosphere. The electrolysis is performed by using a 50% aqueous sulfuric acid solution. The anodic electrolysis is carried out by dipping the substrate 20 as an anode in an electrolyte and applying an electric current to the electrolyte at a current density of 1 to 6 A/dm$^2$ for 10 to 60 seconds. This effectively removes the oxidized coating from those portions of the substrate 20 not covered by the ink layer 12.

The substrate 20 next undergoes electrolytic plating at portions other than where the ink layer 12 is formed on the substrate 20. This process forms plating layer 13. The ink layer 12 effectively acts as an insulator, so that the plating layer 13 is not formed on the surface of the ink layer 12. The plating layer 13 is a layer obtained by laminating plural plating layers which will be described later. The plating layer 13 is formed according to the following steps (i) to (iv).

(i) Primary plating

Figure 11:
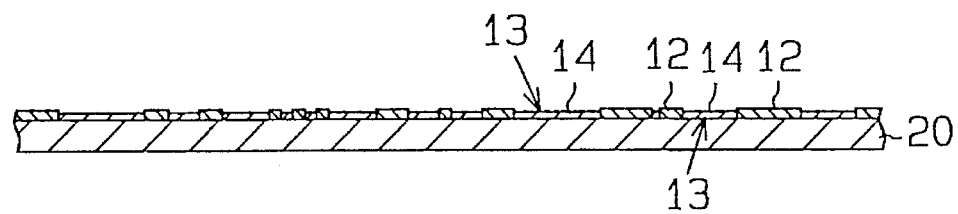
FIG. 11 is a sectional view of the decorative plate illustrating the formation of a primary plating layer on the stainless steel plate.

Nickel plating is effected by dipping the substrate 20 in an electrolyte comprising 100 g/l of hydrochloric acid (HCl) and 250 g/l of nickel chloride ($NiCl_2$). The nickel plating is carried out by applying an electric current to the electrolyte at ordinary temperature at a current density of 3 to 5 $A/dm^2$ for 30 seconds to 2 minutes. As shown in FIG. 11, the primary plating treatment forms a primary plating layer 14 on portions other than where the ink layer 12 has been applied to the substrate 20. The thickness of the primary plating layer 14 is about 0.1 to 0.2 μm.

(ii) Copper plating

Figure 12:
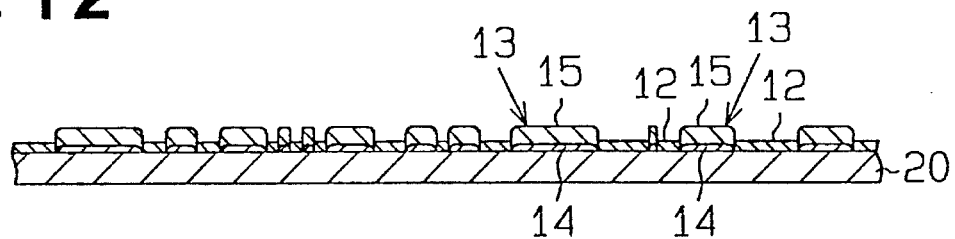
FIG. 12 is a sectional view of the decorative plate illustrating the formation of a copper plating layer on the primary plating layer.

Copper plating is performed by dipping the primary plated substrate 20 in an electrolyte comprising 170 g/l of copper sulfate ($CuSO_4$), 50 g/l of sulfuric acid and 45 ml of a gloss agent (Such as in the product produced under the trade name cupracid 210 by OKUNO CHEMICAL IND. CO., LTD). As shown in FIG. 12, a copper plating layer 15 is formed on the primary plating layer 14. The gloss agent is added for the purposes of obtaining gloss of the surface of the resulting plating layer and also for smoothing the surface of the plating layer, i.e., improving the leveling property of the plating layer. The copper plating is carried out by applying an electric current to the electrolyte at ordinary temperature at a current density of 2 to 5 $A/dm^2$ for 60 to 120 minutes. The relatively thick copper plating layer 15, thus firmed, is about 40 to 80 μm.

(iii) Nickel plating

Figure 13:
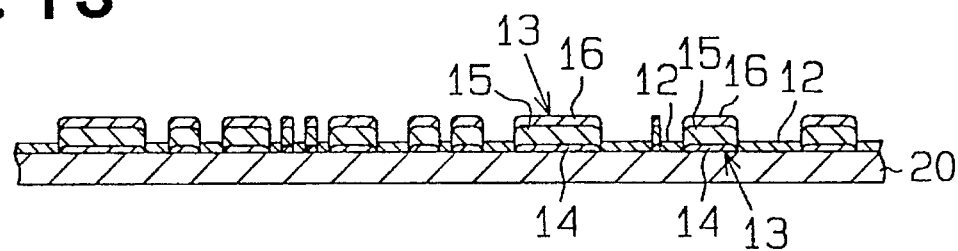
FIG. 13 is a sectional view of the decorative plate illustrating the formation of a nickel plating layer on the copper plating layer.

Nickel plating is performed by dipping the copper plated substrate 20 in an electrolyte comprising 45 g/l of nickel chloride ($NiCl_2$) and small amounts of nickel sulfate ($NiSO_4$), boric acid ($H_3BO_3$) and a gloss agent (such as in the product produced under the trade name Topreona NL-1 by OKUNO CHEMICAL IND. CO., LTD). The nickel plating is carried out by applying an electric current to the electrolyte at ordinary temperature at a current density of 3 to 5 A/dm for 30 seconds to 2 minutes. As shown in FIG. 13, a nickel plating layer 16 is formed on the copper plating layer 15. The thickness of the nickel plating layer 16 is about 2 to 3 μm.

(iv) Gold plating

Next, the nickel plated substrate 20 is subject to a gold plating electrolysis process using an aqueous solution comprising 3 g/l of a product produced under the trade name Auro Glo JR 75 by Meltex Co. Auro Glo JR 75 is essentially a potassium cyanoaurate ($K(Au(CN)_4)$) product. In addition to Auro Glo JR 75, a 750 ml/l of a vat solution containing cobalt and 10 ml/l of a replenishing solution also containing cobalt is used as an electrolyte. Gold plating is carried out by applying an electric current to the electrolyte at 40° to 50° C. at a current density of 0.2 to 0.5 $A/dm^2$ for 1.5 to 2.5 minutes.

Figure 14:
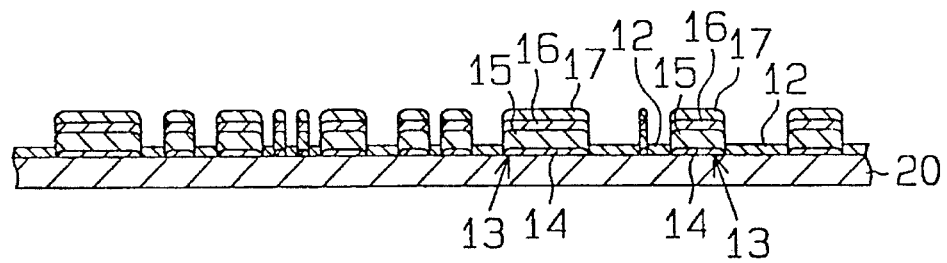
FIG. 14 is a sectional view of the decorative plate illustrating the formation of a gold plating layer on the nickel plating layer.
Figure 15:
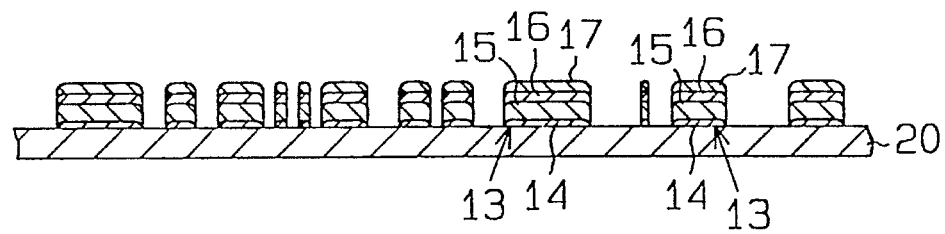
FIG. 15 is a sectional view of the decorative plate illustrating the formation of the ink layer is removed from the surface of the substrate.

As shown in FIG. 14, a gold plating layer 17 is formed on the nickel plating layer 16. The thickness of the gold plating layer 17 formed by the plating is about 0.1 μm.

(7) Removing ink layer

The substrate 20 after completion of the plating treatments is dipped in a hydrocarbon based organic solvent. By applying ultrasonic vibration to the organic solvent, the ink layer 12 on the surface of the substrate 20 is removed by dissolution. Finally, the surface of the substrate 20 is washed with water. At this time, if the substrate 20 is a color substrate, color tones are formed at the portions from which the ink layer 12 is removed.

After the above dissolution process, the substrate 20 is punched by a pressing machine and divided into plural substrates (12 substrates in this embodiment) to produce the desired decorative plate 1. This decorative plate 1 can be used as a metal card, such as a so-called trading card.

In the decorative plate 1 thus obtained, the shadow of the pattern portion can be expressed clearly by a difference in thickness of the lines. Further, the amount of reflected light varies depending on the angle at which the decorative plate is seen, so that the card's color tone also varies. For example, facial expression of the portrait of the pattern can be various displayed. Therefore, the pattern of the decorative plate 1 looks like a photograph and has excellent decorative property, due to the following reason. The pattern and background of the negative film 7 are based on large numbers of the lines 5 set apart from each other at predetermined intervals, the gold plating layer 3, expressing the pattern and background captured on the negative film 7 is based on the lines 4, and reflection of light occurs at the respective lines 4.

Figure 16:
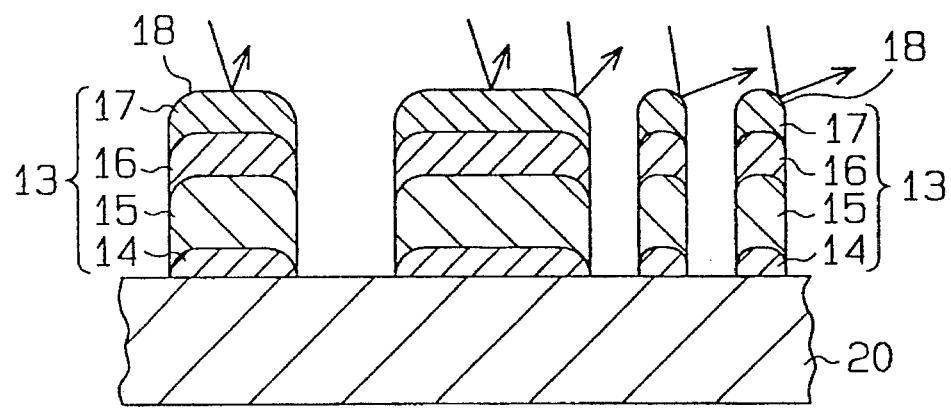
FIG. 16 is an enlarged sectional view of the decorative plate illustrating various patterns of light reflection off of the plating layer.

Further, as shown in FIG. 16, the multilayered plating layer 13 includes a corner portion 18, at the top of the plating layer 13, which is formed in a circular arc shape. This construction causes light incident at the corner portion 18 to be reflected at various angles. Pattern distinctiveness is enhanced by the contrast between the portion corresponding to the portrait of the pattern is formed of the oblique lines 40 and the background portion is formed of the horizontal lines 41.

Moreover, the plating layer 13 is formed only after removal of the oxidized coating on the surface of substrate 20 is removed. This ensures a high degree of adhesiveness of the plating layer 13 to the substrate 20. In the event that flexural stress deforms the decorative pattern portion of the decorative plate 1 or that an impact force is applied to the decorative plate 1 by dropping it, or that the decorative plate 1 is exposed to corrosion, the plating layer 13 at the pattern portion will not peel off of the substrate 20. Thus, the decorative plate 1 has excellent durability.

In addition, the substrate 20 is made of stainless steel and its surface has gloss of a silver color or a desired color and weighty appearance, whereby it is suitable as a decorative plate.

A second embodiment of the present invention will now be described with reference to FIGS. 17 to 22. In this embodiment, a light-sensitive resin is directly coated on a colored stainless steel plate. After the masking layer is printed and developed using a negative photographic film, gold plating is performed. The following steps describe the process of forming a decorative plate according to the second embodiment.

(1) Step of forming light-sensitive resin layer

Figure 17:
FIG. 17 is a sectional view of the decorative plate illustrating the formation of a light-sensitive resin layer on a color stainless steel plate of a second embodiment.

As a metal plate, a stainless steel plate having a predetermined color is used. As shown in FIG. 17, a resin layer 9 is formed on the surface of the color stainless steel plate 2 by silk screen printing of an acrylic light-sensitive resin peeled using an alkali product produced under the trade name Photomal ET by Okuno Seiyaku Kogyo Co. The resin layer 9 is uniformly coated on the surface of the color stainless steel plate 2. In this case, the light-sensitive resin may be also coated by a roll coater or the like.

(2) Preparing negative film

A negative film 7 on which the same images as in the first embodiment are formed is prepared. Portions of the negative film 7 corresponding to the gold plated portion of the substrate 20, are developed black in order to block the transmission of light through the film at those portions.

(3) Curing light-sensitive resin

Figure 18:
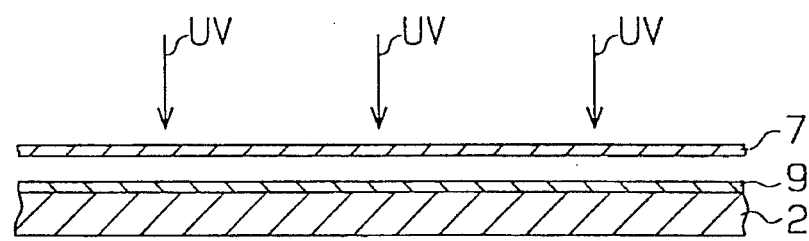
FIG. 18 is a sectional view of the decorative plate illustrating the process of irradiating UV rays through a negative film to the plate of FIG. 17.

In this printing step, the negative film 7 is placed above the color stainless steel plate 2 formed with the resin layer 9, as shown in FIG. 18. UV rays are irradiated through the negative film 7 by a UV ray irradiator to carry out printing of the light-sensitive resin. The UV irradiation can take place at a distance of 30 cm from the color stainless steel plate 2 for 1 minute by a mercury lamp with an output of 3 KW.

(4) Removing uncured resin

Figure 19:
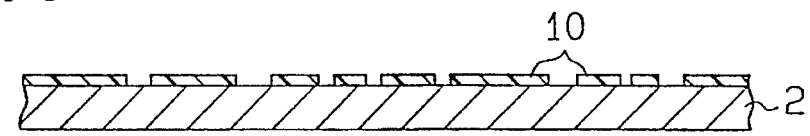
FIG. 19 is a sectional view of the decorative plate illustrating the formation of a cured resin layer on the plate of FIG. 18.

In this developing step, an uncured light-sensitive resin on the color stainless steel plate 2 is removed by washing with a 1 to 3% aqueous sodium carbonate solution. As shown in FIG. 19, a cured resin layer 10 as a masking layer is formed on the color stainless steel plate 2 in this step.

(5) Anodic oxidation

Figure 20:
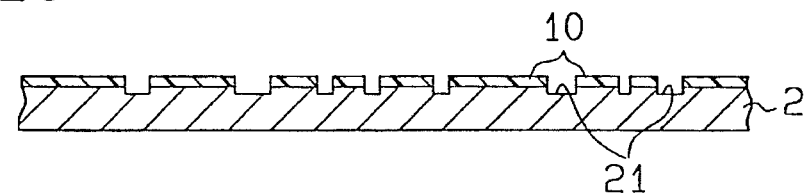
FIG. 20 is a sectional view of the decorative plate illustrating the formation of concave portions produced by etching the surface of the stainless steel plate of FIG. 19.

In this step, surface potions of the color stainless steel plate 2 not having the cured resin layer 10 are etched with a 50% aqueous sulfuric acid solution. The anode is made of the color stainless steel plate 2. Color portions of the color stainless steel plate 2 are removed by applying an electric current to the color stainless steel plate 2 at a current density of 1 to 6 A/dm$^2$ for several seconds. As shown in FIG. 20, concave portions 20 on the color stainless steel plate 2 are formed by the etching process.

(6) Activating surface

The color stainless steel plate next undergoes an anodic oxidation process by being dipped in a 50% aqueous hydrochloric acid solution, which etches the surface of the colored stainless steel.

(7) Gold plating

The gold plating process is next carried out using an aqueous electrolytic solution comprising 3 g/l of potassium cyanoaurate (K(Au(CN)$_4$)), 750 ml/l of a vat solution containing cobalt and 10 ml/l of a replenishing solution containing cobalt. In this embodiment, the cyanoaurate product produced under the trade name Auro Glo JR 75 by Meltex Co. is used. Gold plating is carried out by applying an electric current to the electrolyte at 40° to 50° C. at a current density of 0.2 to 0.5 A/dm$^2$ for 1.5 to 2.5 minutes.

Figure 21:
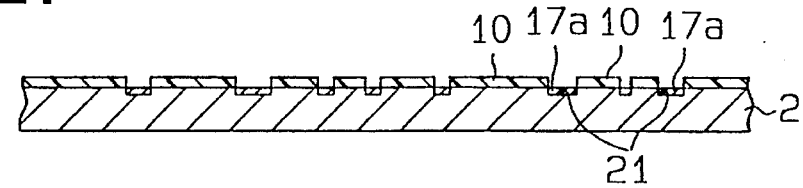
FIG. 21 is a sectional view of the decorative plate illustrating the formation of a gold plating layer on concave portions of the present invention as shown in FIG. 20.

As shown in FIG. 21, by the gold plating treatment, a gold plating layer 17a is formed in the concave portions 21. The thickness of the gold plating layer 17a is about 0.1 μm. As described above, the gold plating layer 17a is thin, so that the surface of the gold plating layer 17a and the surface of the stainless steel plate 2 are substantially the same level.

(8) Removing masking layer

Figure 22:
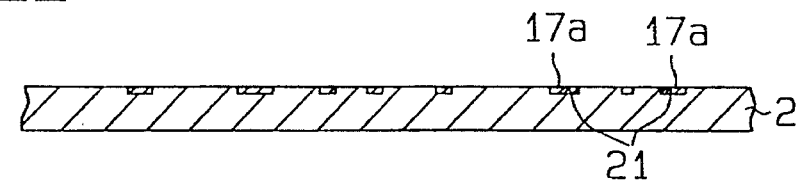
FIG. 22 is a sectional view showing the plate of FIG. 21 with the cured resin layer removed.

As shown in FIG. 22, after the gold plating process, the surface of the stainless steel plate 2 is washed with a 5% aqueous sodium hydroxide solution. As a result, the cured resin layer 10 on the stainless steel plate 2 is removed.

Through the steps described above, the decorative plate 1 is formed having a predetermined pattern drawn on the color stainless steel plate 2. In the decorative plate 1, only the gold plating layer 17a is formed on the color stainless steel plate 2. This permits the thin lines of the image contained on the film 7 are to be more accurately reproduced, enhancing the sharpness and faithful reproduction of the original pattern. Further, a portion of the cured resin layer 10 of the color stainless steel plate 2 is removed. This allows the color of the stainless steel plate 2 to be seen. This further improves the decorative property of the reproduced pattern. Moreover, only the thin gold plating layer 17a is formed in the concave portions 21. The reproduced pattern, consequently is formed substantially flat with respect to the surface of the substrate 20.

Although only two embodiments of the present invention have been described herein, it should be apparent to those skilled in the art that the present invention may be embodied in many other specific forms without departing from the spirit or scope of the invention. Particularly, it should be understood that the following modes are to be applied.

(1) Rather than using a negative photographic film as described in the above two embodiments, a positive film may be used.

(2) In the first embodiment, a cured resin layer is formed by coating a light-sensitive resin directly on a substrate 20 to form a resin layer 9, placing a negative film 7 or a positive film thereabove and irradiating uv rays through the film. Thereafter, plating treatments are carried out. It should be noted that screen printing can be omitted. If it is, the a corner portion 18 of the resulting plating layer 13 will have more of an angular surface than a round surface. Therefore, the pattern of a decorative plate 1 will appear sharper with less of a shadow.

(3) The masking step as described above can be carried out by an offset printing method. More specifically, a negative film 7 or a positive film can be placed above an aluminum plate on which a light-sensitive resin solution is coated. UV rays then can be irradiated to the light-sensitive resin solution through the film to form a cured resin layer. The cured resin layer is transferred to the surface of a roller having a rubber layer, and printed to a substrate using the roller to form an ink layer. Here, the ink layer is thinner in comparison with the ink layers obtained by the silk screen printing method as described in the first two embodiments. According to this method the corner portion of a plating layer will have less of a round surface, thus imparting a sharper image with less of a shadow to the pattern of a decorative plate 1.

(4) The masking step can be carried out by a letterpress printing method. More specifically, a light-sensitive resin layer can be formed on a resin plate via a base resin layer. A positive or negative film 7 would be placed on the resin plate, and UV rays irradiated through the film to form a cured resin layer. Next, ink would be coated on the cured resin layer and printed on a substrate to form an ink layer. This method results in a pattern on the decorative plate becoming sharper with less of a shadow as in the case when offset printing method is used.

(5) The masking step is carried out by a gravure printing method. More specifically, a negative film 7 or a positive film is placed on a metal plate on which a light-sensitive resin solution is coated, and UV rays are irradiated to form a cured resin layer. Any uncured resin is then removed by being dissolved with an etching solution. Ink is coated on concave portions of the metal plate and printed on a substrate to form an ink layer. In this case, in the resulting decorative plate, shadow of a pattern is reduced similarly in a way similar to the shadow reduction achieved by using the letterpress printing method.

(6) A conductive metal such as copper, brass, iron and silver may be used for the metal plate. Using such types of metals simplifies the preplating procedures, in that these metals reduce the incidence of having an oxidized layer form on the substrate 20. Removal of the oxidized layer, as described above, is unnecessary. Further, a plating layer 13 is easily formed on copper or brass, reducing the time required for plating.

(7) In the first embodiment, plating treatments are completed in three steps, a step of primary plating, a step of copper plating and a step of nickel plating. Alternatively, a decorative plate having a pattern of a silver-gray color due to nickel can be used. Alternatively, plating treatments can be carried out by using a combination of a primary plating step and a copper plating step. Here, a decorative plate having a pattern of a reddish brown color due to copper plating can be obtained.

(8) In the first embodiment, a pattern portion with a flat appearance by making the thickness of a copper plating layer 15 thinner during the copper plating step or by even omitting the step of copper plating. Alternatively, the gradation or height of the image may be reduced in comparison with the first embodiment. This allows the appearance of the reproduced image to more closely approximate that of the photograph. Moreover, a thick portion and a thin portion of a plating layer 13 can be provided in one decorative plate 1. For example, the plating layer 13 at a portrait portion can be made thick while the plating layer 13 at a background portion can be made thin.

(9) The angles of the lines 5 may be combined at different angles to produce varying degrees of contrast. In particular, plural oblique lines having different angles may be combined, oblique lines and vertical lines may be combined, oblique lines, vertical lines and horizontal lines may be combined, or spiral lines or concentric lines may be combined. This allows added contrast to the pattern of a decorative plate, further improving its appearance.

(10) In place of the light-transmissible film described in the first embodiment, a transparent resin film may be used on which a large number of lines are drawn at predetermined intervals.

(11) The decorative plate 1 of the present invention may be used as a name plate, a trading card or the like.

(12) The decorative plate 1 of the present invention may be used by coating an adhesive on a back surface thereof, sticking a removable paper to the back surface, removing the paper when the decorative plate 1 is used and sticking the decorative plate 1 to a predetermined place.

(13) In the second embodiment, copper plating or nickel plating may be used in place of gold plating to change decorative property.

(14) In the second embodiment, a common stainless steel plate which is not colored may be used as a stainless steel plate.

Therefore, the present examples and embodiments are to be considered as illustrative and not restrictive and the invention is not to be limited to the details given herein, but may be modified within the scope of the appended claims.

What is claimed is:

1. A decorative plate having a plating layer portion on a metal substrate, said plate comprising:

said layer portion forming a pattern, said pattern having an object portion and a background portion;

a first group of plurality of lines representing a degree of a shade of the object portion, said lines in the first group extending parallel to one another;

a second group of plurality of lines representing a degree of a shade of the background portion, said lines in the second group extending parallel to one another; and said lines in the first group and said lines in the second group extending in different directions from one another.

2. The decorative plate as set forth in claim 1, wherein said metal substrate includes a stainless plate.

3. The decorative plate as set forth in claim 1, wherein said layer portion includes plural plating layers.

4. The decorative plate as set forth in claim 3, wherein said layer portion includes a plurality of plating layers laminated one over another.

5. The decorative plate as set forth in claim 4, wherein an uppermost layer is formed by a gold plating.

6. The decorative plate as set forth in claim 1, wherein said lines have a line density set to a number of substantially 50 to 80 per an inch.

7. The decorative plate as set forth in claim 6, further comprising a bottom edge wherein said lines of said first group extend in a horizontal direction relative to said bottom edge and said lines of said second group extend in a different direction from the lines of said first group.

8. The decorative plate as set forth in claim 6, wherein at least one of said lines includes a thicker portion.

9. The decorative plate as set forth in claim 1, wherein said lines in the first group and said lines in the second group are both formed on one selected from a group consisting of the layer portion and portions other than the layer portion in the plate.

* * * * *